United States Patent [19]

Agoston

[11] Patent Number: 4,647,795
[45] Date of Patent: Mar. 3, 1987

[54] TRAVELLING WAVE SAMPLER

[75] Inventor: Agoston Agoston, Beaverton, Oreg.
[73] Assignee: Tektronix, Inc., Beaverton, Oreg.
[21] Appl. No.: 845,900
[22] Filed: Mar. 28, 1986
[51] Int. Cl.$^4$ ...................... H03K 17/16; H03K 17/74
[52] U.S. Cl. .................................... 307/352; 307/572; 307/259; 307/320; 328/151
[58] Field of Search ............... 307/256, 259, 320, 321, 307/572, 352, 353; 328/151

[56] References Cited

U.S. PATENT DOCUMENTS 3,459,968  8/1969  Kraus ................................. 307/259
3,629,731 12/1971  Frye .................................. 307/259
4,399,413  8/1983  Bosselaers .......................... 307/256
4,417,157 11/1983  Gershberg et al. ................... 307/256

Primary Examiner—John Zazworsky
Attorney, Agent, or Firm—John P. Dellett

[57] ABSTRACT

A travelling wave sampler has an input terminal for receiving an input signal to be sampled. A first diode has its anode connected to the input terminal, whereas a second diode has its cathode connected to the input terminal. A first delay line is connected between the cathode of the first diode and the anode of a third diode, and a second delay line is connected between the anode of the second diode and the cathode of a fourth diode. A strobe generator provides negative-going strobe pulses to the cathode of the third diode through a first strobe capacitor and provides positive-going strobe pulses to the anode of the fourth diode through a second strobe capacitor. The third and fourth diodes are maintained in zero biased condition when strobe pulses are not provided by the strobe generator and are forward biased during the strobe pulses. At the end of a strobe pulse, the charge that was accumulated on the strobe capacitors during the strobe pulse drives the third and fourth diodes into reverse biased condition.

17 Claims, 3 Drawing Figures

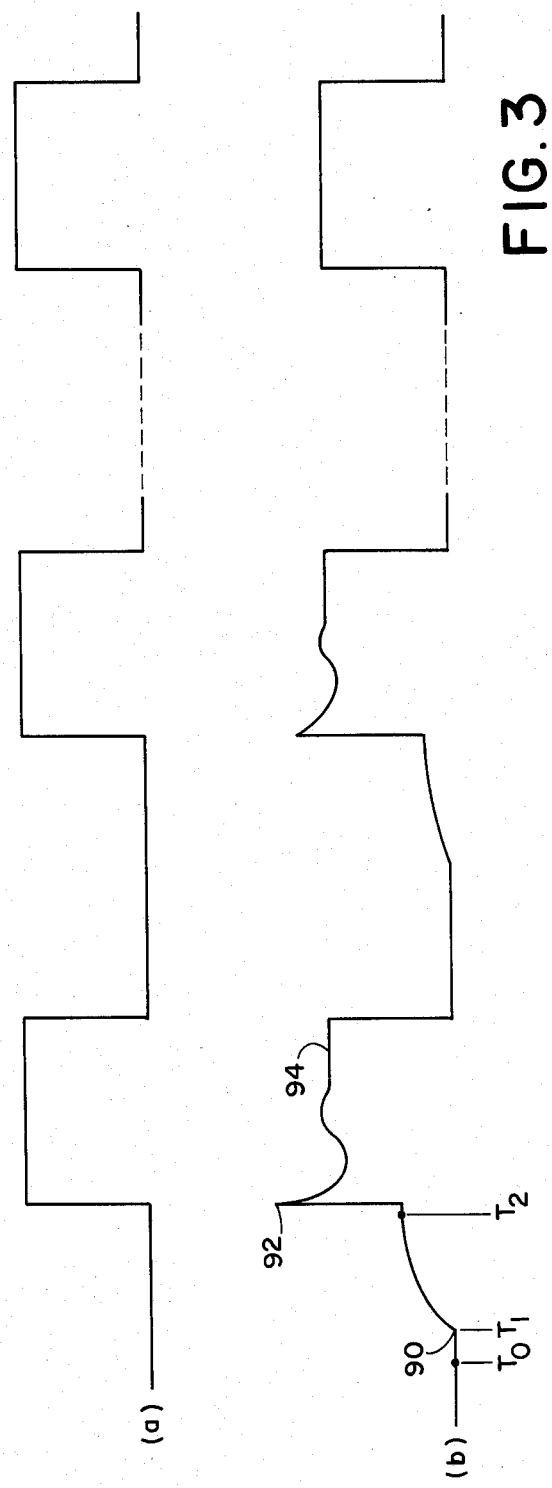

TRAVELLING WAVE SAMPLER

This invention relates to samplers and particularly, but not exclusively, to travelling wave samplers.

BACKGROUND OF THE INVENTION

As shown in FIG. 1, the conventional six-diode travelling wave sampler, for example as used in the sampling head of a digital oscilloscope, comprises two chains of three series-connected diodes 2, 4, 6 and 8, 10, 12, the two chains being connected in parallel with opposite polarity. Short delay lines 14 and 16 are connected between the diodes 4 and 6 and the diodes 10 and 12 respectively. The diodes are biased into the off state by diode chains 20 and 22 and bias voltage sources 28 and 30. In order to sample the signal present at the input terminal 24, negative-going and positive-going strobe pulses are applied to the cathode of the diode 6 and to the anode of the diode 12 by a strobe generator 18 by way of coupling capacitors 32 and 34 and transmission lines 36 and 38. The diodes 2-12 are turned on at the leading edge of the strobe, and therefore charge is permitted to propagate from the signal input terminal 24 to the delay lines 14 and 16 by way of the diodes 2, 4, 8 and 10 and transmission lines 40 and 42. Charge continues to propagate through the diodes 2, 4, 8 and 10 and the transmission lines 40 and 42 to the delay lines 14 and 16 so long as the diodes 2-12 remain on. The diodes are turned off at the trailing edge of the strobe, and therefore signal charge present on the delay lines is trapped between the diodes 4 and 6 and the diodes 10 and 12. The rise time of the sampler (the time for which signal charge is permitted to accumulate on the delay lines) is approximately equal to the round trip time on the delay lines 14 and 16, e.g., 25 ps. The charge that is trapped on the delay lines has a common mode component that is related to the voltage of the input signal. The common mode charge is applied to a summing node A at the input of an error amplifier 26. An inverting amplifier 27 has its input connected to the input terminal 24 through a resistor 46. The charge received by the amplifier 27 is inverted and injected into the summing node A through a variable capacitor 48. The output terminal of the amplifier 26 is connected to apply positive feedback to the bias network for the diodes 2-12 through an integrator 50 having a memory gate. The memory gate receives a memory gate pulse from the strobe generator, and the memory gate is conductive during the memory gate pulse. The leading edge of the memory gate pulse is synchronous with the strobe pulse. At the end of the memory gate pulse, the memory gate becomes non-conductive and breaks the positive feedback loop, in order to prevent uncontrolled oscillation. The positive feedback provided by the amplifier 26 adjusts the level at which bias is applied to the diodes 2-12, so that immediately following each strobe pulse the amplifier 26 provides an output voltage that represents the difference between the input signal voltage at a sampling point and the input signal voltage at the previous sampling point.

One of the problems that arises in a diode sampler is known as blowby distortion. Blowby is the transfer of charge through a diode when in the off state. In a travelling wave sampler, blowby affects the quantity of charge that is captured on the delay lines when the diodes are in the on state and therefore distorts the value of the error signal that is generated by the error amplifier and is fed back to the bias network. In the FIG. 1 sampler, blowby is compensated by the resistor 46 and capacitor 48, which transfer to the input of the amplifier 26 a charge that is opposite in polarity but substantially equal in magnitude to that provided to the amplifier 26 through the diodes 2, 4, 8 and 10, the resistors 52 and 54 and the coupling capacitor 56 when the diodes are in the off state and therefore cancels the effect of the charge transferred through the diodes. The series combination of resistance and capacitance in each circuit branch leading from the terminal 24 to the amplifier 26 acts as a high-pass filter, blocking low frequency components in the charge transferred to the amplifier. The diodes 2 and 8 are connected in series with the diodes 4 and 10 in order to reduce the capacitance of each branch of the sampler and thereby increase the cut-off frequency of the high-pass filters. Although the capacitor 48 is variable, allowing manual adjustment to match the magnitude of the charge transmitted through the capacitor 48 to that transmitted through the capacitance of the diodes 2 and 8, this method of compensating blowby is subject to the disadvantage that it cannot readily be adjusted, in particular during operation of the sampler.

A second limitation to which the FIG. 1 sampler is subject arises from the fact that the strobe pulses must be of sufficient amplitude that they are able to overcome the sum of all the reverse biases of the diodes 2-12 in order to turn on these diodes at the leading edge of the strobe and to turn off the diodes at the trailing edge of the strobe and thereby trap the signal charge on the delay lines. The reverse bias of the diodes 2 and 8 must be sufficient that these diodes do not turn on between strobe pulses. Therefore the amplitude of the strobe pulses imposes a limit on the dynamic range of input signals that can be sampled accurately.

SUMMARY OF THE INVENTION

In accordance with a first aspect of the invention, a dynamic bias circuit comprises a diode, a strobe generator for generating strobe pulses of predetermined magnitude and duration and at predetermined intervals, and a coupling capacitor for coupling strobe pulses to a first electrode of the diode. A bias potential source is connected to the first electrode of the diode, and a resistor is connected in parallel with the diode, whereby the diode is in a substantially zero biased state immediately before a strobe pulse is generated by the strobe pulse generator, is forward biased during the strobe pulse, and is reverse biased immediately after the strobe pulse due to the presence on the coupling capacitor of a charge that accummulated during the strobe pulse.

In accordance with a second aspect of the invention, a travelling wave sampler has an input terminal for receiving an input signal to be sampled. A first diode has its anode connected to the input terminal, whereas a second diode has its cathode connected to the input terminal. A first delay line is connected between the cathode of the first diode and the anode of a third diode, and a second delay line is connected between the anode of the second diode and the cathode of a fourth diode. A strobe generator provides negative-going strobe pulses to the cathode of the third diode through a first strobe capacitor and provides positive-going strobe pulses to the anode of the fourth diode through a second strobe capacitor. The third and fourth diodes are maintained in zero biased condition when strobe pulses are not provided by the strobe generator and are forward biased during the strobe pulses. At the end of a strobe pulse, the charge that was accumulated on the strobe capacitors during the strobe pulse drives the third and fourth diodes into reverse biased condition.

In accordance with a third aspect of the invention, a sampler has an input terminal for receiving an input signal to be sampled. A sampling diode has one electrode connected to the input terminal of the sampler and its opposite electrode coupled to a first input terminal of an error amplifier. A capacitive divider comprising two capacitors is connected between the input terminal of the sampler and a reference potential level, and the second input terminal of the error amplifier is coupled to the connection point of the two capacitors. The capacitance of the capacitor connected between the reference potential level and the connection point of the divider is dependent on the voltage at the connection point. A bias voltage source is connected to the connection point for adjusting the voltage at the connection point of the divider. By use of a feedback connection between the output of the amplifier and the bias voltage source, a charge dependent on the voltage present at the input terminal of the sampler may be applied to the second input terminal of the error amplifier in order to compensate for blowby through the sampling diode.

BRIEF DESCRIPTION OF THE DRAWINGS

For a better understanding of the invention, and to show how the same may be carried into effect, reference will now be made, by way of example, to the accompanying drawings in which:

FIG. 3 is a graph illustrating one aspect of the operation of the FIG. 2 sampler.

In the different figures, like reference numerals designate corresponding elements.

DETAILED DESCRIPTION

Figure 2:
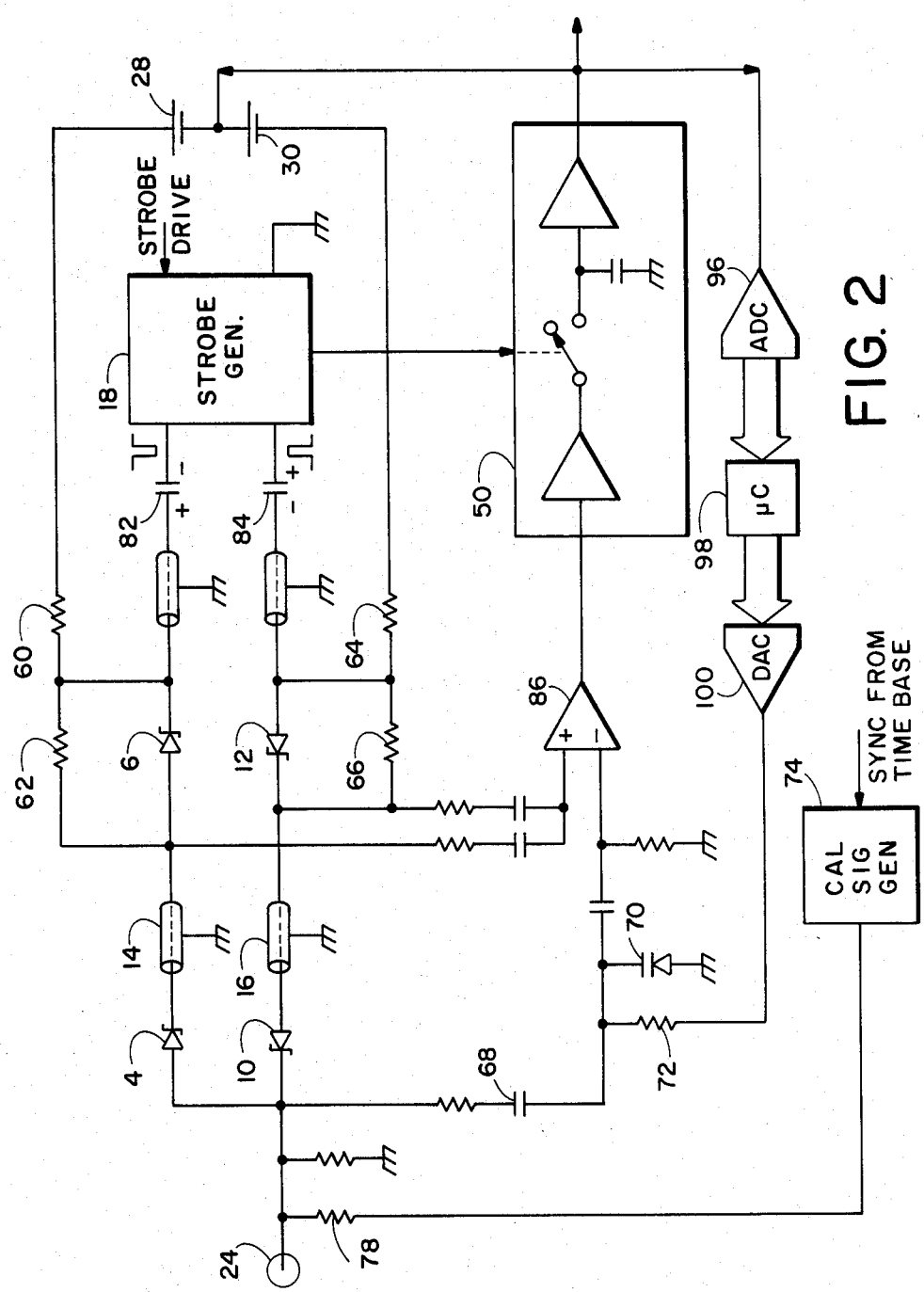
FIG. 2 is a similar view of a sampler embodying the present invention.

In the sampler shown in FIG. 2, the sampling diodes 4 and 10 are reverse biased by the bias voltage sources 28 and 30 through resistors 60, 62 and 64, 66. The charge-trapping diodes 6 and 12, connected in parallel with the resistors 62 and 66, are dynamically biased: immediately prior to a strobe pulse the diodes are in a zero bias condition, during the strobe pulse the diodes are forward biased (and the capacitors 82 and 84 are charged), for a short time after the strobe pulse the charge that was accumulated on the strobe capacitors 82 and 84 during the strobe pulse causes the diodes to be reverse biased, and by the time that the next strobe pulse occurs the capacitors 82 and 84 have discharged through the resistors 60 and 64 and the diodes are zero biased once more.

Figure 1:
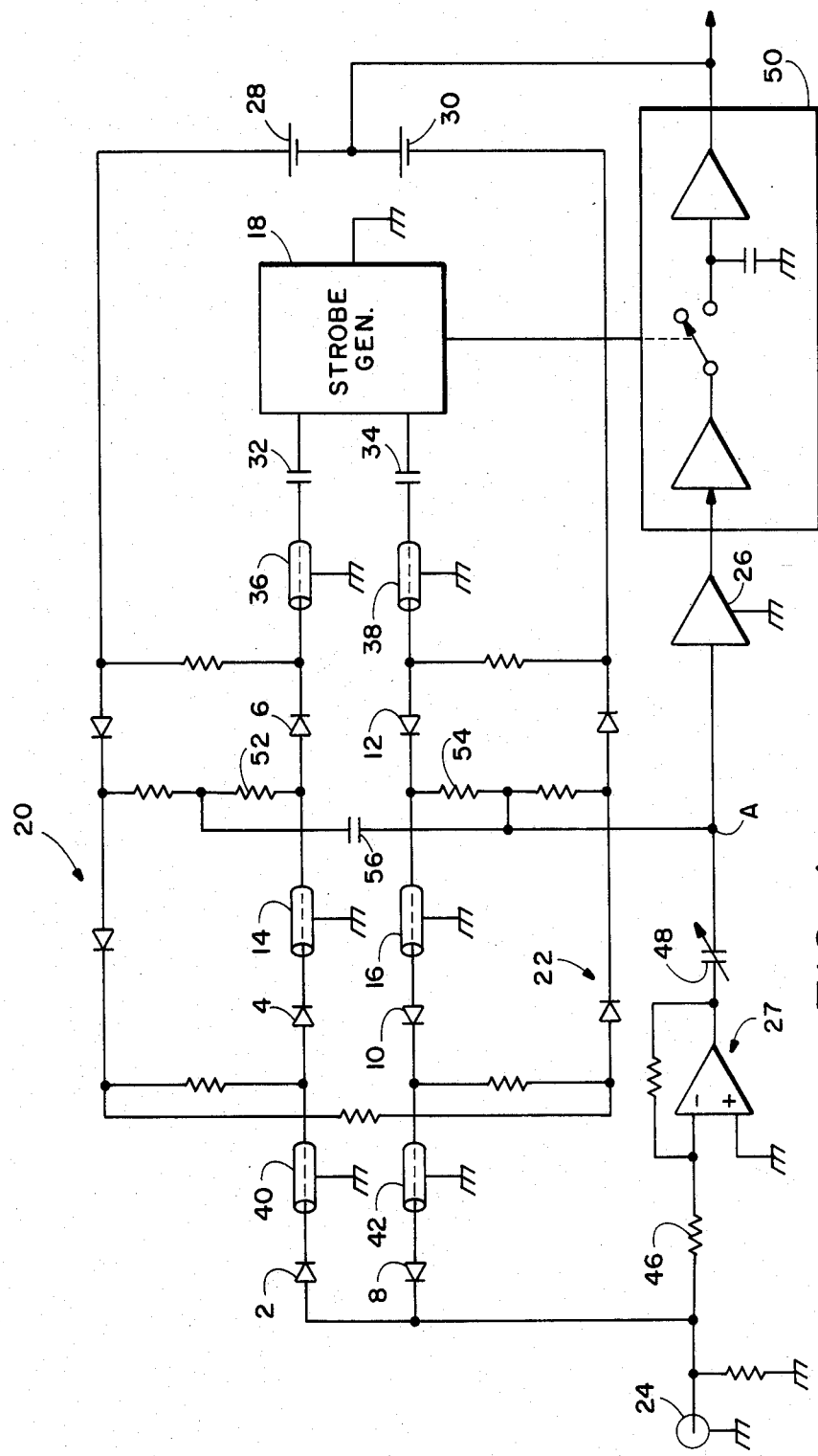
FIG. 1 is a schematic diagram, partly in block form, of a conventional sampler.

The common mode charge trapped on the delay lines is applied to the non-inverting input of a differential amplifier 86. The error signal developed at the output of the amplifier 86 is applied to the integrator 50, and the output signal of the integrator is fed back to the connection point of the bias voltage sources 28 and 30. Therefore, immediately before each strobe pulse the potential at the cathode of the diode 6 is equal to the potential at the anode of that diode, and the absolute value with respect to ground of the potential at the cathode of the diode 6 is equal to the potential at the anode of that diode at the end of the previous strobe pulse. Similarly, immediately before a strobe pulse the diode 12 is zero biased and the absolute value of the potential at its anode is equal to the potential at its cathode at the end of the previous strobe pulse. Therefore, the voltage change at the output terminals of the strobe generator need only be sufficient to overcome the reverse bias of one diode in each branch of the sampler (the diodes 4 and 10), and the dynamic range of input signal that can be sampled accurately for a given strobe amplitude is increased as compared with the arrangement shown in FIG. 1.

The capacitor 68 and the variable capacitance diode 70 connected in series between the input terminal 24 and ground form a capacitive divider, the dividing ratio of which is controlled by a blowby control voltage that is applied to the diode 70 through a resistor 72. The value of the blowby control voltage may be adjusted during a self-calibration sequence, when the terminal 24 is not connected to receive a signal from a device under test. A calibration signal generator 74 applies a repetitive calibration signal having the waveform shown in FIG. 3(a) to the input terminal through a resistor 78. The waveform is a square wave having a positive-going transition that coincides substantially with the trailing edge of the memory gate pulse. The transition of the calibration signal waveform need not be so sharp as the transitions of the strobe pulse, but its rise time should be substantially shorter than the memory gate width (the interval for which the memory gate in the integrator 50 is rendered conductive by the strobe generator 18). Up to the time $t_1$ (at which the memory gate becomes conductive), the voltage at the output terminal of the sampler, shown in FIG. 3(b), remains constant. If the value of the blowby control voltage is such that blowby is not fully compensated, the output voltage increases when the memory gate becomes conductive, as shown at the point 90 of the waveform shown in FIG. 3(b), and the output voltage exhibits a characteristic overshoot 92 followed by a damped return to the proper level 94 when the memory gate becomes non-conductive. In the blowby voltage control circuit, the output signal is sampled at the time $t_0$ (shortly before the memory gate becomes conductive) and at the time $t_2$ (just before the memory gate becomes non-conductive once more) using an analog-to-digital converter (ADC) 96. A microcomputer ($\mu$C) 98 compares the two sample values and applies a digital signal to a digital-to-analog converter (DAC) 100 having a voltage output. The digital signal is converted to a voltage such as to ultimately bring the value of the second sample to the value of the first sample. The waveform of the output signal then conforms to the waveform of the calibration signal, and the blowby distortion has been compensated.

It will be appreciated that the present invention is not restricted to the particular sampler that has been described and illustrated, and that variations may be made therein without departing from the scope of the invention. For example, the dynamic biasing of the charge-trapping diodes may be used in a sampler that does not have electrically-controlled blowby compensation, and electrical control of blowby compensation is applicable to conventional two-diode and four-diode samplers. The functions of the ADC 96, microcomputer 98 and DAC 100 of the blowby voltage control circuit may be implemented by components of a digital oscilloscope with which the sampler is used, instead of its being necessary to provide dedicated components in the sampler itself.

I claim:

1. A dynamic bias circuit comprising a diode having first and second opposite electrodes and having a forward biased state, a reverse biased state and a zero biased state, a strobe pulse generator for generating strobe pulses of predetermined magnitude and duration and at predetermined intervals, a coupling capacitor connected between the strobe pulse generator and the first electrode of the diode, a bias potential source, a first resistor connected between the bias potential source and the first electrode of the diode, and a second resistor connected between the first and second electrodes of the diode, whereby the diode is in its zero biased state immediately before a strobe pulse is generated by the strobe pulse generator, is forward biased during the strobe pulse, and is reverse biased immediately after the strobe pulse due to the presence on the capacitor of a charge that accumulated during the strobe pulse.

2. A dynamic bias circuit according to claim 1, comprising an amplifier having an input terminal coupled to the second electrode of the diode and also comprising an integrator coupled between an output terminal of the amplifier and the reference potential source, whereby the absolute value of the potential at the first and second electrodes of the diode immediately before a strobe pulse is dependent on the potential that previously existed at the second electrode of the diode.

3. A dynamic bias circuit according to claim 1, comprising a second diode connected in series with the first-mentioned diode and with the same polarity as the first-mentioned diode, said second diode being reverse biased by the bias potential source when the first-mentioned diode is in its zero biased state.

4. A travelling wave sampler having an input terminal for receiving an input signal to be sampled, a first diode having its anode connected to the input terminal, a second diode having its cathode connected to the input terminal, third and fourth diodes, a first delay line connected between the cathode of the first diode and the anode of the third diode, a second delay line connected between the anode of the second diode and the cathode of the fourth diode, a strobe generator having first and second output terminals at which it provides negative-going and positive-going strobe pulses respectively, a first capacitor coupling the first output terminal of the strobe generator to the cathode of the third diode, a second capacitor coupling the second output terminal of the strobe generator to the anode of the fourth diode, and bias means for maintaining the third and fourth diodes in zero biased condition immediately before strobe pulses are present at the output terminals of the strobe generator, whereby the strobe pulses are effective to forward bias the third and fourth diodes and to charge the capacitors, and immediately following the strobe pulses the charge stored on the first and second capacitors during the strobe pulses drives the third and fourth diodes into reverse biased condition.

5. A sampler according to claim 4, wherein the bias means comprise first and second resistors connected respectively to the cathode of the third diode and the anode of the fourth diode, a source of bias voltage connected between the first and second resistors, and third and fourth resistors connected in parallel with the third and fourth diodes respectively.

6. A sampler according to claim 5, comprising an amplifier coupled to the anode of the third diode and the cathode of the fourth diode for developing an output signal dependent on the charge present on the delay lines, and feedback means for receiving the output signal of the amplifier and applying a feedback signal derived from the output signal of the amplifier to the bias means, whereby the absolute value with respect to ground of the potential at the cathode of the third diode and the anode of the fourth diode when in zero biased condition is dependent on the charge present on the delay lines.

7. A sampler according to claim 6, wherein the amplifier is a differential amplifier having a first input terminal coupled to the anode of the third diode and the cathode of the fourth diode and a second input terminal coupled to the input terminal of the sampler, and the sampler further comprises means for applying charge dependent on the voltage present at the input terminal of the sampler to the second input terminal of the amplifier in order to compensate for blowby through the first and second diodes.

8. A sampler according to claim 7, wherein the input terminal of the sampler is coupled to the second input terminal of the amplifier through a third capacitor, and the third capacitor is connected in series with a fourth capacitor between the input terminal of the sampler and a predetermined potential level, the capacitance of the fourth capacitor being dependent on the potential difference across the fourth capacitor.

9. A sampler according to claim 8, wherein the predetermined potential level is a fixed reference potential level, and the sampler further comprising calibration means for automatically adjusting the voltage present at the connection of the third and fourth capacitors in response to the output of the amplifier.

10. A sampler according to claim 9, wherein the calibration means comprise means for supplying a calibration signal to the input terminal of the sampler during an interval when the sampler is not connected to a device under test, comparison means for determining whether the output signal developed by the sampler in response to the calibration signal has the same waveform as the calibration signal, and means for adjusting the voltage present at the connection of the third and fourth capacitors in response to the comparison means.

11. A sampler according to claim 10, wherein the strobe generator is operative to generate a memory gate pulse synchronously with the strobe pulse, and the feedback means include a memory gate that is rendered conductive by the memory gate pulse, and the calibration signal has a rectangular waveform including a stepform transition that substantially coincides with the end of the memory gate pulse and the comparison means are operative to compare the voltage of the output signal of the sampler just prior to the end of the memory gate pulse with the voltage of the output signal before the beginning of the memory gate pulse and generate a correction signal representative of the difference between these voltages.

12. A sampler having an input terminal for receiving an input signal to be sampled, first and second sampling diodes connected at the anode and cathode respectively to the input terminal, a first capacitor connected to the input terminal of the sampler, a second capacitor connected between the first capacitor and a predetermined potential level, the capacitance of the second capacitor being dependent upon the potential difference across the second capacitor, an error amplifier having a first input terminal coupled to the connection point of the first and second capacitors and a second input terminal coupled to the cathode of the first diode and the anode of the second diode, and capacitor bias means for adjusting the potential difference across the second capacitor.

13. A sampler according to claim 12, wherein the predetermined potential level is a fixed reference potential level and the bias means are operative to adjust the voltage at the connection point of the first and second capacitors.

14. A sampler according to claim 13, wherein the capacitor bias means are effective to adjust the voltage at the connection point of the first and second capacitors in response to the voltage present at the output terminal of the amplifier.

15. A sampler according to claim 15, comprising a strobe generator for applying strobe pulses to the cathode and anode respectively of the first and second diodes, diode bias means connected to the cathode and anode respectively of the first and second diodes for reverse biasing the first and second diodes, and feedback means connecting the output terminal of the error amplifier to the diode bias means for adjusting the absolute value with respect to ground of the potential at the cathode and anode respectively of the first and second diodes, said feedback means including a memory gate that is rendered conductive by a memory gate pulse generated by the strobe generator synchronously with the strobe pulse, and wherein the capacitor bias means comprise voltage means for applying a voltage to the connection point of the first and second capacitors and calibration means for adjusting that voltage.

16. A sampler according to claim 15, wherein the calibration means comprise means for applying a calibration signal to the input terminal of the sampler during an interval when the sampler is not connected to a device under test, and comparison means for determining whether the output signal developed by the sampler in response to the calibration signal has the same waveform as the calibration signal and applying a correction signal that depends on the result of the determination to the voltage means.

17. A sampler according to claim 16, wherein the calibration signal has a rectangular waveform including a step-form transition that substantially coincides with the end of the memory gate pulse and the comparison means are operative to compare the voltage of the output signal of the sampler just prior to the end of the memory gate pulse with the voltage of the output signal prior to the beginning of the memory gate pulse and apply a correction signal that depends on the difference between these voltages to the voltage means.

* * * * *